United States Patent
Shirota

(10) Patent No.: US 9,715,935 B2
(45) Date of Patent: Jul. 25, 2017

(54) NON-VOLATILE SEMICONDUCTOR MEMORY WITH HIGH RELIABILITY AND DATA ERASING METHOD THEREOF

(71) Applicant: Winbond Electronics Corp., Taichung (TW)

(72) Inventor: Riichiro Shirota, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/729,066

(22) Filed: Jun. 3, 2015

(65) Prior Publication Data

US 2016/0099064 A1 Apr. 7, 2016

(30) Foreign Application Priority Data

Oct. 2, 2014 (JP) ................. 2014-204065

(51) Int. Cl.
*G11C 11/34* (2006.01)
*G11C 16/04* (2006.01)
*G11C 16/14* (2006.01)
*G11C 16/34* (2006.01)
*G11C 11/56* (2006.01)
*G11C 16/16* (2006.01)

(52) U.S. Cl.
CPC .......... *G11C 16/14* (2013.01); *G11C 11/5635* (2013.01); *G11C 16/16* (2013.01); *G11C 16/3445* (2013.01); *G11C 16/0483* (2013.01)

(58) Field of Classification Search
None
See application file for complete search history.

(56) References Cited

U.S. PATENT DOCUMENTS 5,191,551 A * 3/1993 Inoue .................... H01L 27/115
257/316
6,721,204 B1 4/2004 Yeh et al.
(Continued)

FOREIGN PATENT DOCUMENTS

JP H10228786 8/1998
JP H11250678 9/1999
(Continued)

OTHER PUBLICATIONS

Jang et al., "Vertical Cell Array using TCAT (Terabit Cell Array Transistor) Technology for Ultra High Density NAND Flash Memory", 2009 Symposium on VLSI Technology Digest of Technical Papers, Jun. 16-18, 2009, pp. 192-193.
(Continued)

*Primary Examiner* — Harry W Byrne
*Assistant Examiner* — Sultana Begum
(74) *Attorney, Agent, or Firm* — Jianq Chyun IP Office

(57) ABSTRACT

A non-volatile semiconductor memory apparatus and a data erasing method thereof are provided to suppress deterioration in reliability due to data rewriting. An erasing method of a flash memory is provided, which includes the following steps. A control gate is maintained at 0V, a high-voltage erase pulse is applied to a P well, such that electrons is emitted from a floating gate to the P well. Then, the control gate is again maintained, and a weak erase pulse with a voltage lower than the erase pulse is applied to the P well.

14 Claims, 15 Drawing Sheets

(56) References Cited

U.S. PATENT DOCUMENTS

| | | | |
|---|---|---|---|
| 2003/0235080 A1* | 12/2003 | Yaegashi | G11C 16/3468 365/185.22 |
| 2006/0056240 A1* | 3/2006 | Shappir | G11C 16/16 365/185.29 |
| 2009/0052255 A1 | 2/2009 | Moon et al. | |
| 2012/0182811 A1 | 7/2012 | Wang et al. | |

FOREIGN PATENT DOCUMENTS

| | | |
|---|---|---|
| JP | 2005506653 | 3/2005 |
| JP | 2008226421 | 9/2008 |
| JP | 2009070546 | 4/2009 |
| JP | 2011014817 | 1/2011 |
| JP | 2012-027979 | 2/2012 |
| TW | I265521 | 11/2006 |
| WO | 9818132 | 4/1998 |

OTHER PUBLICATIONS

Tanaka et al., "Bit Cost Scalable Technology with Punch and Plug Process for Ultra High Density Flash Memory", 2007 Symposium on VLSI Technology Digest of Technical Papers, Jun. 12-14, 2007, pp. 14-15.

Chen et al., "A High Scalable 8-layer Vertical Gate 3D NAND with Split-page Bit Line Layout and Efficient Binary-sum MiLC (Minimal Incremental Layer Cost) Staircase Contacts", IEDM, IEEE, Dec. 10-13, 2102, pp. 2.3.1-2.3.4.

Schwank et al., "Radiation Effects in MOS Oxide", IEEE Transactions on Nuclear Science, vol. 55, No. 4, Aug. 2008, pp. 1833-1853, line 6 of the right column, p. 1836.

"Office Action of Korean Counterpart Application", issued on Apr. 27, 2016, with English translation thereof, p1-p7, in which the listed references were cited.

"Office Action of Taiwan Counterpart Application", issued on Jun. 21, 2016, p1-p8, in which the listed reference was cited.

* cited by examiner

Initial

After 3000 times of data writing

Cross-sectional diagram of NOR cell array

NON-VOLATILE SEMICONDUCTOR MEMORY WITH HIGH RELIABILITY AND DATA ERASING METHOD THEREOF

CROSS-REFERENCE TO RELATED APPLICATION

This application claims the priority benefit of Japan application serial no. 2014-204065, filed on Oct. 2, 2014. The entirety of the above-mentioned patent application is hereby incorporated by reference herein and made a part of this specification.

BACKGROUND

Field of the Invention

The invention relates to the reliability of an NAND or an NOR flash memory and a method for providing a flash memory with less reliability deterioration even a writing and an erasing operations are repeatedly performed.

Description of Related Art

FIG. 1 is a schematic cross-sectional diagram illustrating a structure of a cell array of an NAND flash memory. FIG. 2 is an equivalent circuit diagram of the cell array. An N well 12 is formed in a P-type silicon substrate 10. A P well 14 is formed in the N well 12. A plurality of transistors, which constitutes a NAND string, are formed on the P well 14. An NAND string includes a plurality of memory cells connected in serial, a source line selection transistor connected with one terminal of a memory cell and a bit line selection transistor connected with the other terminal. Referring to FIG. 1, each memory cell includes a control gate (word lines WL1, WL2 . . . WLn) 20, a selection gate 22 at the source line selection transistor, and a selection gate 24 at the bit line selection transistor. In the P well 14, a plurality of NAND strings are formed along a row direction, and the NAND strings in one P well 14 constitute a block.

A source line SL is electrically connected to an n-diffusion region (a source region) 23 of the source line selection transistor, a bit line BL is electrically connected to an n-diffusion region (a drain region) 23 of the bit line selection transistor. Moreover, a p+ diffusion region 26 for a contact portion is formed in the P well 14, and an n+ diffusion region 27 is formed in the N well 12. The diffusion regions 26 and 27 are connected via a common contact portion 28 of the N well/P well. When an erasing operating is to be performed on the selected block, a high-voltage erase pulse is applied to the P well via the common contact portion 28, which will be described below.

Referring to FIG. 2, a plurality of word lines WL1, WL2 . . . WLn are formed along the row direction crossing with the NAND strings, and the word lines WL are connected in common to the control gate 20 of the corresponding memory cell in the row direction. The selection gate lines SGS are connected in common to the selection gate 22 of the source line selection transistor in the row direction. The selection gate lines DSG are connected in common to the selection gate 24 of the bit line selection transistor in the row direction. When the source line selection transistor is conducted via the selection gate lines SGS, the NAND strings are electrically connected to a source line SL, and when the bit line selection transistor is conducted via the selection gate lines DSG, the NAND strings are electrically connected to a bit line BL.

FIG. 3 is a graph illustrating voltage waveforms of each node in the block selected to be erased when the erasing operation is performed on the NAND flash memory. A node N1 represents a waveform of the common contact portion 28 of the N well/P well, N2 represents a waveform of the diffusion region 23 used by the contact portion of the source line SL, N3 represents a waveform of the selection gate 22 of the source line selection transistor, N4 represents a waveform of the word lines (the control gate) 20 in the same block, N5 represents a waveform of the selection gate 24 of the bit line selection transistor, and N6 represents a waveform of the diffusion region used by the contact portion of the bit line BL. Furthermore, in a non-selected block, N4 has a waveform in the same manner as N3 or N5 in the block selected to be erased.

In the NAND flash memory, the data erasing operation is performed by a block unit. At this time, word lines in the selected block are set to 0 V or a voltage lower than a voltage of the P well, the P well 14 forming the memory cell array is applied with an erase pulse Ps having a strip-type positive voltage, and after the erase pulse Ps is applied, the potential of the P well 14 returns to 0 V. In this case, each of the nodes N2, N3, N5 and N6 is boosted by a capacitive coupling effect with the P well 14. After the erasing operation is performed, whether a threshold of each memory cell in the selected block is under a specific value is determined through a verify-read operation. If the threshold of each cell in the block is under the specific value, the erasing operation is completed; however, if the threshold of a part of the cells is over the specific value, the erase pulse Ps is applied again and perform the verify-read operation (e.g., see Patent document 1).

During a writing operation, the P well 14 is set to 0 V, and a high voltage is applied to a selected word line. The bit line BL is applied with 0 V or a positive potential. In a scenario of applying 0 V, a silicon surface of the selected cell has 0 V and a tunnel current of the electrons flowing from the silicon substrate toward the floating gate is generated. Thereby, the threshold of the cells becomes higher than the specific value.

In the NAND flash memory, a memory cell array in a three-dimensional form is proposed in order to improve the degree of integration (see non-patent literatures 1, 2 and 3). For instance, a poly silicon pillar serving as the channel region are formed from the silicon substrate in a vertical direction, and a plurality of control gates are formed along the poly silicon pillar. A layer for accumulating charges is formed between the control gates and the channel portion.

LITERATURES OF RELATED ART

Patent document 1: Japanese Patent Publication No. 2012-027979

Non-patent literature 1: Vertical Cell Array using TCAT (Terabit Cell Array Transistor) Technology for Ultra High Density NAND Flash Memory, Jaehonn Jang et. al, 2009 Symposium on VLSI Technology Digest of Technical Papers, p 192-193.

Non-patent literature 2: Bit Cost Scalable Technology with Punch and Plug Process for Ultra High Density Flash Memory, H. Tanaka et al., 2007 Symposium on VLSI Technology Digest of Technical Papers, P 14-15.

Non-patent literature 3: A High Scalable 8-layer Vertical Gate 3D NAND with Split-page Bit Line Layout and Efficient Binary-sum MiLC (Minimal Incremental Layer Cost) Staircase Contacts, Shin-Hung et. al, IEDM12-21, P2.3.1-2.3.4.

In the conventional NAND flash memory, repeatedly performed writing/erasing operations result in deterioration in the oxide film under the floating gate, which usually causes poor writing due to the increase in the range of the threshold distribution width during data reading, or causes corruption of the data left over after the data writing operation. Accordingly, the number of times for data rewriting has to be limited. Otherwise, the reliability cannot be ensured if the number is over a threshold. There are several reasons that may cause the oxide film deterioration, and one of the known reason is oxide film deterioration existing in a period lasting after the erase pulse is applied to the P well until the writing operation is performed. The data writing is performed repeatedly within an interval after the erase pulse is applied to the P well until a write pulse is applied to the word lines. FIG. 4 (A) and FIG. 4 (B) illustrates results of detecting I-V characteristics of the cells. Specifically, two types of intervals, 0.05 seconds (presented in a solid line) and 0.5 seconds (presented in a dotted line), from the erasing operation to the writing operation are prepared in this case. FIG. 4 (A) illustrates initial I-V characteristics, and FIG. 4 (B) illustrates the I-V characteristics after 3000 times of data rewriting. According to the graphs, in the I-V characteristics after 3000 times of data rewriting, the case of the interval of 0.5 seconds has a greater change in comparison with the initial I-V characteristics. Namely, in case the interval from erasing to writing becomes longer, a trap level of a silicon interface is increased, and thus, potential dependence of the control gate of the I-V characteristics is mitigated. Therefore, it is assumed that the left-over after the erase pulse is applied may cause the oxide film deterioration. Such oxide film deterioration causes deterioration in reliability to miniaturized memory cells and results in the reduction of the times for the rewriting operation that may maintain the reliability.

SUMMARY

Accordingly, the invention provides a non-volatile semiconductor memory apparatus capable of suppressing the reliability deterioration caused by data writing.

In a period of the verify-read operation after the erase pulse is applied, the deterioration may occur in the oxide film. Thus, in a preferred embodiment of the invention, a weak erase pulse is applied immediately after each erase pulse is applied. Preferably, the weak erase pulse is set to a positive voltage lower than the positive voltage of the erase pulse commonly applied to the P well which is used to set the word lines of the selected block to 0 V or a lower positive voltage than that of the P well. If the potential of the P well is set to be lower, the tunnel current of electrons flowing from the floating gate toward the silicon substrate does not occur. Therefore, the threshold of the memory cells is not changed, and the application of the weak erase pulse may achieve suppressing the deterioration in reliability of the oxide film.

In the non-volatile semiconductor memory apparatus of a further preferred embodiment, after the control gate is set to 0 V or a positive voltage lower than the P well, and a positive erase pulse is applied to the N well and the P well under the memory cell array, and the electrons are emitted from the floating gate (i.e., the charge accumulation layer) to the silicon substrate, the control gate is again set to 0 V or the positive voltage lower than the P well (in the same manner as above), the initial erase pulse plus a pulse with a positive voltage lower than that of the initial erase pulse applied to the N well and P well are set as a set, and the set of the pulses are applied when the next erase pulse is to be applied. In the time of the pulses applied to the N well and the P well after the erase pulse is applied, it is preferable to prevent the electrons from emitting from the floating gate toward the silicon substrate.

In a further preferred embodiment, after the control gate is set to 0 V, the positive pulse is applied to the N well and the P well under the memory cell array, and the electrons are emitted from the floating gate to the silicon substrate, a peak of the pulse applied to the N well and the P well is reduced in the same process of applying the pulses. The potential provided to the N well and the P well is reduced in the middle of the process, so as to prevent the electrons from emitting from the floating gate toward the silicon substrate.

In a further preferred embodiment, after the control gate is set to 0 V, the positive erase pulse is applied to the N well and the P well under the memory cell array, and the electrons are emitted from the floating gate to the silicon substrate, the potential of the control gate is increased from 0 V in the same process of applying the pulses, and the potential of the control gate is returned to 0 V after the process of applying the positive erase pulse to the N well and the P well is completed. The potential of the control gate is increased from 0 V in the middle of the process, so as to prevent the electrons from emitting from the floating gate toward the silicon substrate and prevent the electrons from injecting from the silicon substrate toward the floating gate.

To sum up, the invention can suppress deterioration of the gate oxide film caused by repeated data writing, so as to increase the number of times for data rewriting that can ensure the reliability.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Various aspects of the implementation of the invention will be described in detail with reference to the accompanying drawings hereinafter. It should be noted that for the sake for comprehension, each element is exaggerated, and the ratio of each element is not the same as each actual element.

Figure 5:
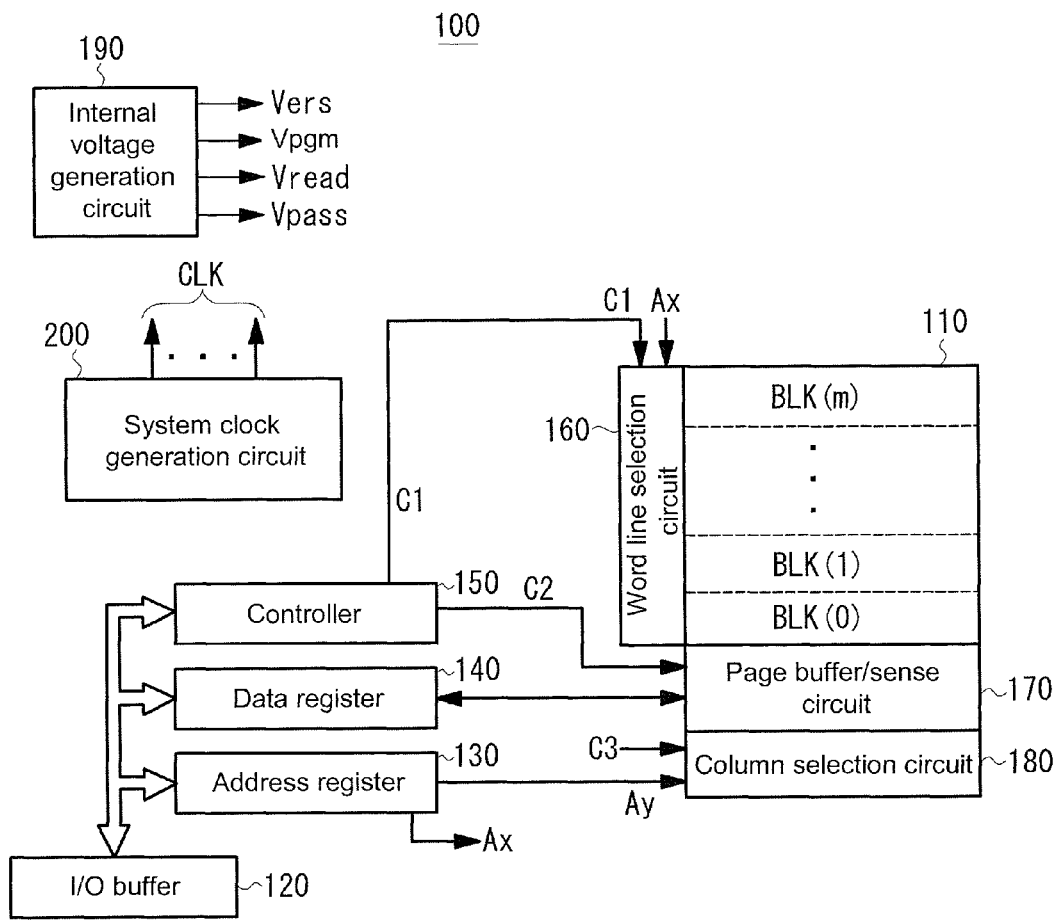
FIG. 5 is a block diagram illustrating an exemplary structure of an NAND flash memory according to an embodiment of the invention.

FIG. 5 is a block diagram illustrating an exemplary structure of an NAND flash memory according to an embodiment of the invention. A flash memory 100 includes a memory array 110 in which a plurality of memory cells arranged in an matrix, an input/output (I/O) buffer 120 connected to an external I/O terminal I/O and maintaining I/O data, an address register 130 for receiving address data from the I/O buffer 120, a data register 140 for maintaining the I/O data, a controller 150 for generating control signals C1, C2 and C3 configured to control each part based on command data and external control signals (e.g., chip enable or address latch enable signals that are not shown) from the I/O buffer 120, a word line selection circuit 160 for decoding row address information Ax from the address register 130 and selecting a block or one or more word lines according to the decoding result, a page buffer/sense circuit 170 for maintaining data read through bit lines or program data through the bit line, a column selection circuit 180 for decoding column address information Ay from the address register 130 and selecting bit lines based on the decoding result, an internal voltage generation circuit 190 for generating voltages for data reading, programming (writing) and erasing, such as a program voltage Vpgm, a pass voltage Vpass, a read voltage Vread, an erase voltage Vers (including erase voltages Ps, Pw)), and a system clock generation circuit 200 for generating an internal system clock CLK.

Figure 2:
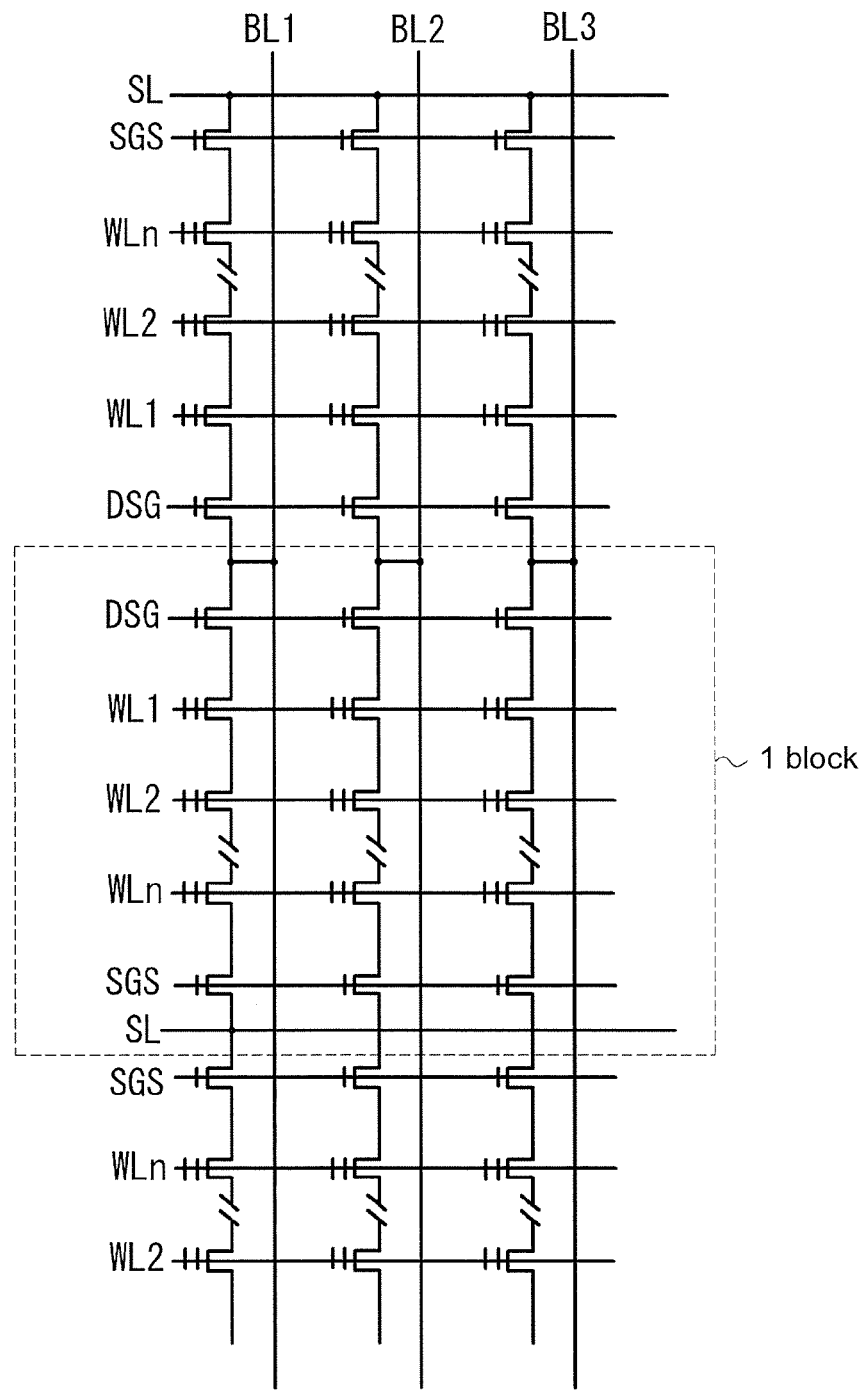
FIG. 2 is an equivalent circuit diagram of the cell array.

Referring to FIG. 2, a memory array 110 includes, for example, NAND strings, each formed by a plurality of memory cells connected in serial. Each memory cell have a metal oxide semiconductor (MOS) structure, and the MOS structure includes a source/drain serving as a n+ diffusion region and formed in a P well, a tunneling oxide film formed on a channel between the source/drain, a floating gate (charge accumulation layer) formed on the tunneling oxide film, and a control gate formed above the floating gate via a dielectric film. Typically, when positive charges are accumulated in the floating gate, i.e., when data "1" is written thereto, a threshold value thereof is in a negative state, and the memory cells are turned on when the control gates have a voltage of 0 V. When electrons are accumulated in the floating gate, i.e., data "0" is written thereto, the threshold value thereof changes to be positive, and the memory cells are turned off when the control gate gates have a voltage of 0 V. However, the memory cell is not limited to store a single bit, and may store a plurality of bits.

TABLE 1

|  | Erasing | Writing | Reading |
|---|---|---|---|
| Selected W/L | 0 | 15~20 V | 0 |
| Non-selected W/L | F | 10 V | 4.5 |
| SGD | F | Vcc | 4.5 |
| SGS | F | 0 | 4.5 |
| SL | F | Vcc | 0 |
| P well | 20 | 0 | 0 |

Table 1 exemplarily lists bias voltages applied by the flash memory when performing various operations. In a reading operation, a specific positive voltage is applied to the bit line, a specific voltage (e.g., 0 V) is applied to one or more selected word line, a pass voltage Vpass (e.g., 4.5 V) is applied to one or more non-selected word line, and a positive voltage (e.g., 4.5 V) is applied to selected gate lines DSG and SGS, such that a bit line selection transistor TD and a source line selection transistor TS are turned on, and 0 V is applied to a common source line. In a programming (writing) operation, a high-level program voltage Vpgm (15 V to 20 V) is applied to the one or more selected word line, and an intermediate pass voltage (e.g., 10 V) is applied to the one or more non-selected word line, such that the bit line selection transistor TD is turned on, the source line selection transistor TS is turned off, and potential corresponding to data "0" or "1" is provided to a bit line GBL.

In an erasing operation, a specific voltage (e.g., 0 V) is applied to the selected word lines (i.e., the control gate) in the block, an erase pulse with a high-voltage (e.g., 20 V) is applied to the P well, such that electrons on the floating gate are extracted to the substrate. Accordingly, data is erased in a block-based manner. The erasing operation of the present embodiment will be described in detail hereinafter.

Subsequently, the erasing operation of a first embodiment of the invention will be described below. Preferably, in order to effectively erasing data from the memory cells, an incremental step pulse erase (ISPE) method is adopted. In this method, an erase pulse is applied to the memory cells of a selected block, and then whether a threshold of the erased memory cells (referred to as erasing units hereinafter) is qualified is determined, and if being disqualified, an erase pulse with a voltage higher than the previous erase pulse is applied to perform the next verification, and the process of applying the erase pulse is repeated until the erasing units in the block are all determined as qualified.

Figure 6:
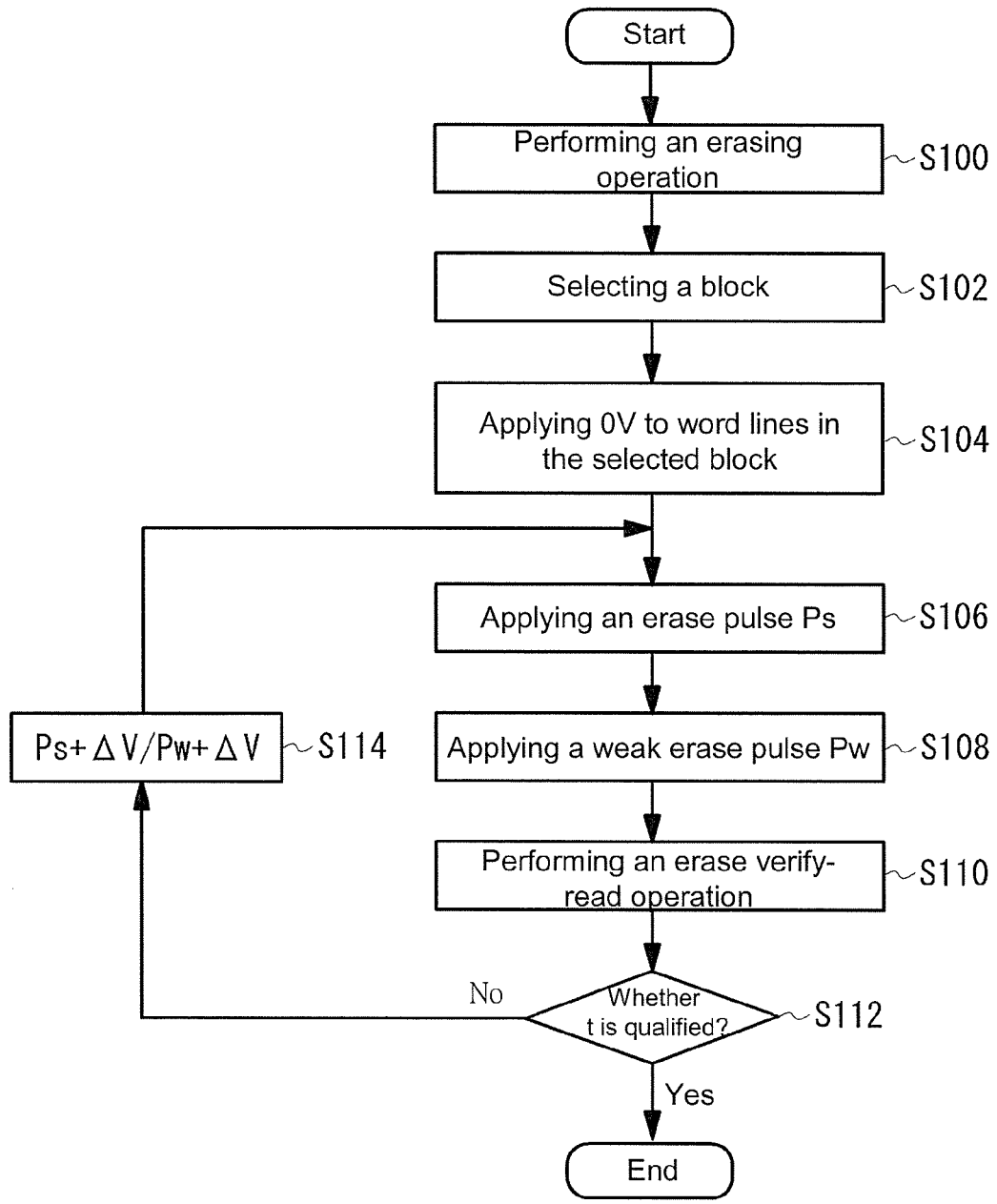
FIG. 6 is a flowchart of an erasing operating of a flash memory according to an embodiment of the invention.

FIG. 6 illustrates a flow of the erasing operation of the first embodiment. When receiving an erase command, the controller 150 starts an erasing operation (step S100). The word line selection circuit 160 selects a block to be erased (step S102), and applies 0 V to word lines of the selected block (step S104). An erase pulse Ps generated by the internal voltage generation circuit 190 is applied to the P well 14 and the N well 12 via a common contact 28 (referring to FIG. 1) (step S106). The erase pulse Ps is applied by, for example, an erase pulse application circuit (not shown) which is controlled by the controller 150.

Figure 3:
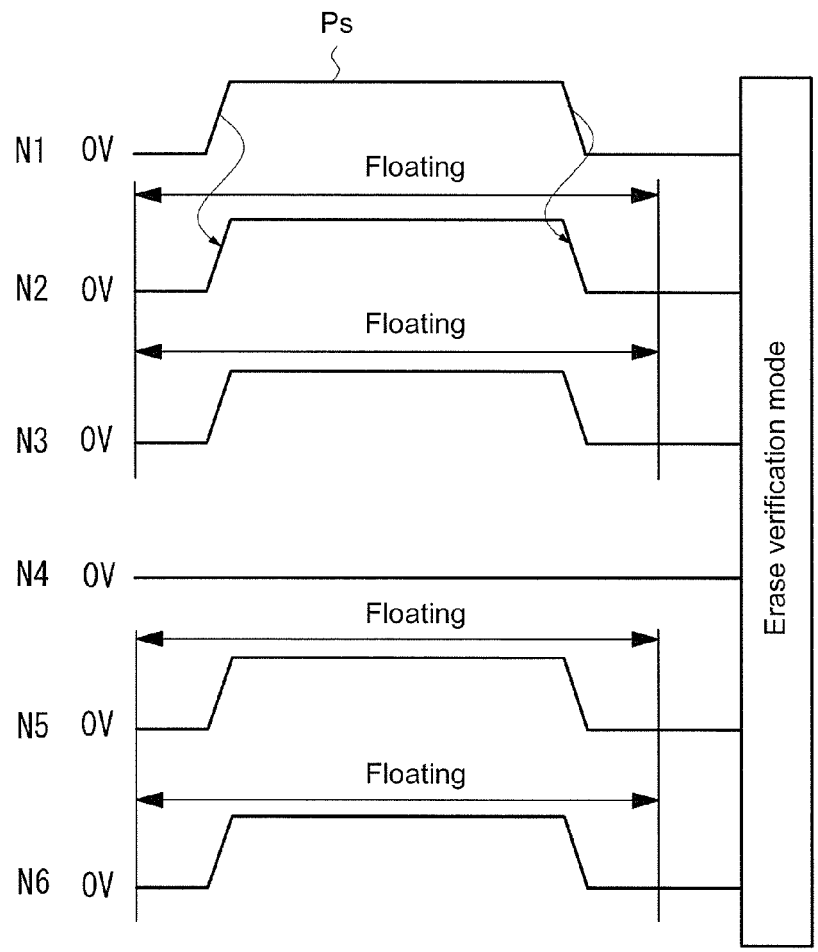
FIG. 3 is a graph illustrating waveforms of voltages of nodes in a conventional NAND flash memory when an erase pulse is applied.
Figure 7:
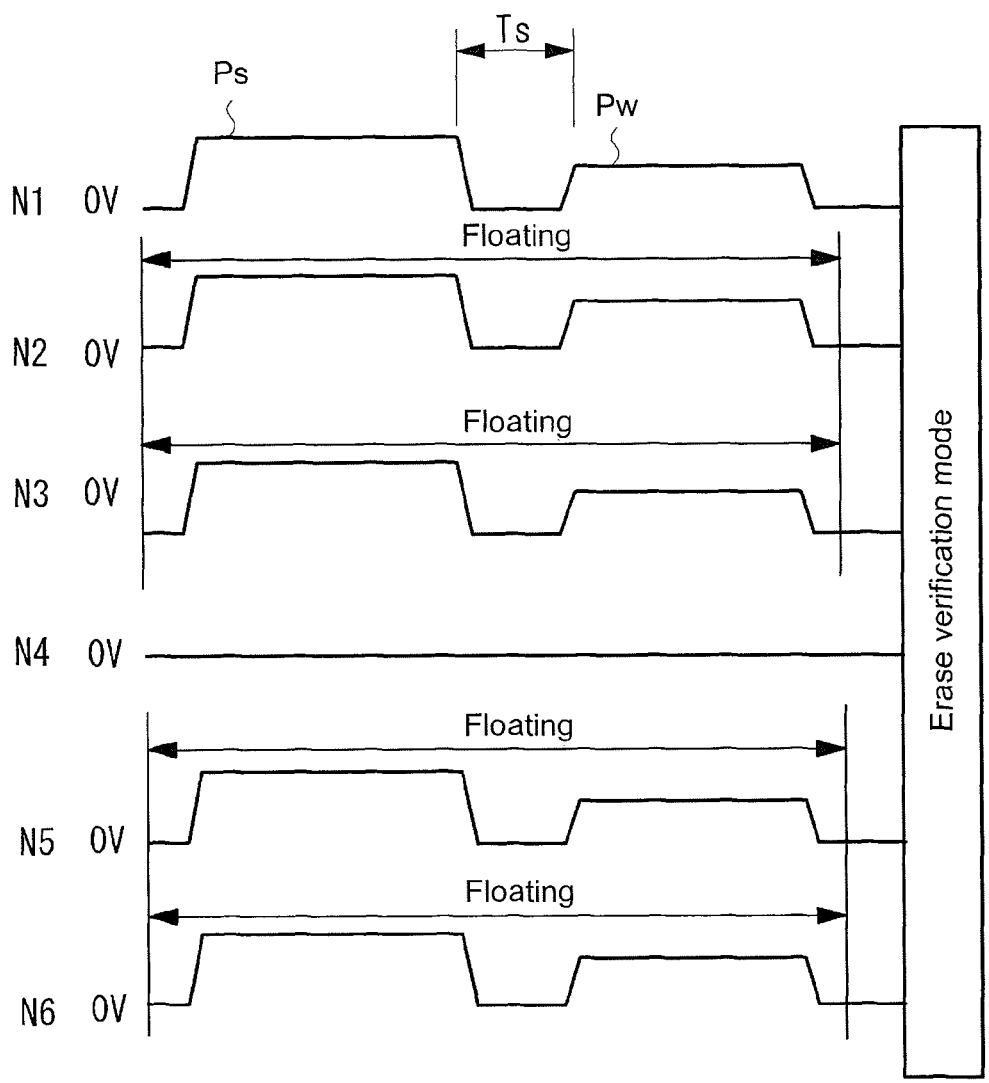
FIG. 7 is a graph illustrating a waveform of an erase pulse applied according to a first embodiment of the invention.

FIG. 7 illustrates waveforms of applying the erase pulse of the first embodiment. Nodes N1 to N6 illustrated herein are the same as those in FIG. 3. At the node N1, when the erase pulse Ps is applied to the P well 14, potentials of the other nodes N2, N3, N5 and N6 are automatically boosted due to a capacitive coupling effect with the P well, and when the application of the erase pulse Ps ends, the potentials of the nodes N2, N3, N5 and N6 are also drop down to the voltage level (e.g., 0 V) before the erasing operation is started.

In the first embodiment, a weak erase pulse Pw is applied immediately after the erase pulse Ps (step S108). The weak erase pulse Pw is applied via the common contact 28 to provide the P well and the N well with specific positive potentials likewise when the erase pulse Ps is applied and to set the control gate (i.e., the selected word line) of the selected block as 0 V. The weak erase pulse Pw is different from the erase pulse Ps in applying a lower potential to the P well than that applied during the erasing operation. Meanwhile, a period of the weak erase pulse Pw may be shorter than that of the erase pulse Ps, such that a size of the weak erase pulse Pw does not cause the electrons to emit from the floating gate to a silicon substrate side in the period.

In the erasing operation, a sufficiently high voltage is provided to the P well 14, and the control gate is set to be 0 V, and thereby, the oxide film right under the floating gate becomes to have a high electric field, and a tunnel current of the electrons flowing from the floating gate to the silicon substrate side is generated. The weak erase pulse Pw is provided to the P well 14 and has a low potential that does not cause the tunnel current of the electrons flowing from the floating gate to the silicon substrate side. The shorter a pulse interval Ts from the application of the erase pulse Ps to the immediately following application of another pulse the better. For example, the interval Ts between the erase pulse Ps and the weak erase pulse Pw is preferably set under 0.5 seconds.

After the weak erase pulse Pw is applied, a read verification operation for determining whether the threshold of the erasing unit is under a specific value is performed (step S110). The erase verification is typically performed based on the bias voltage condition of the reading operation. If the threshold of the erasing unit is under the specific value, it is determined as qualified, and the application of the erase pulse ends. If the threshold of the erasing unit is over the specific value, it is determined as disqualified, (step S112), and an erase pulse Ps with a voltage that is equal to that of the previous erase pulse Ps plus ΔV is generated and applied to the selected block. The voltage of the weak erase pulse Pw may also be maintained at a constant level, but may be generated in the same way so as to be greater than the previous ΔV correspondingly when the voltage of the erase pulse Ps is increased.

Figure 8:
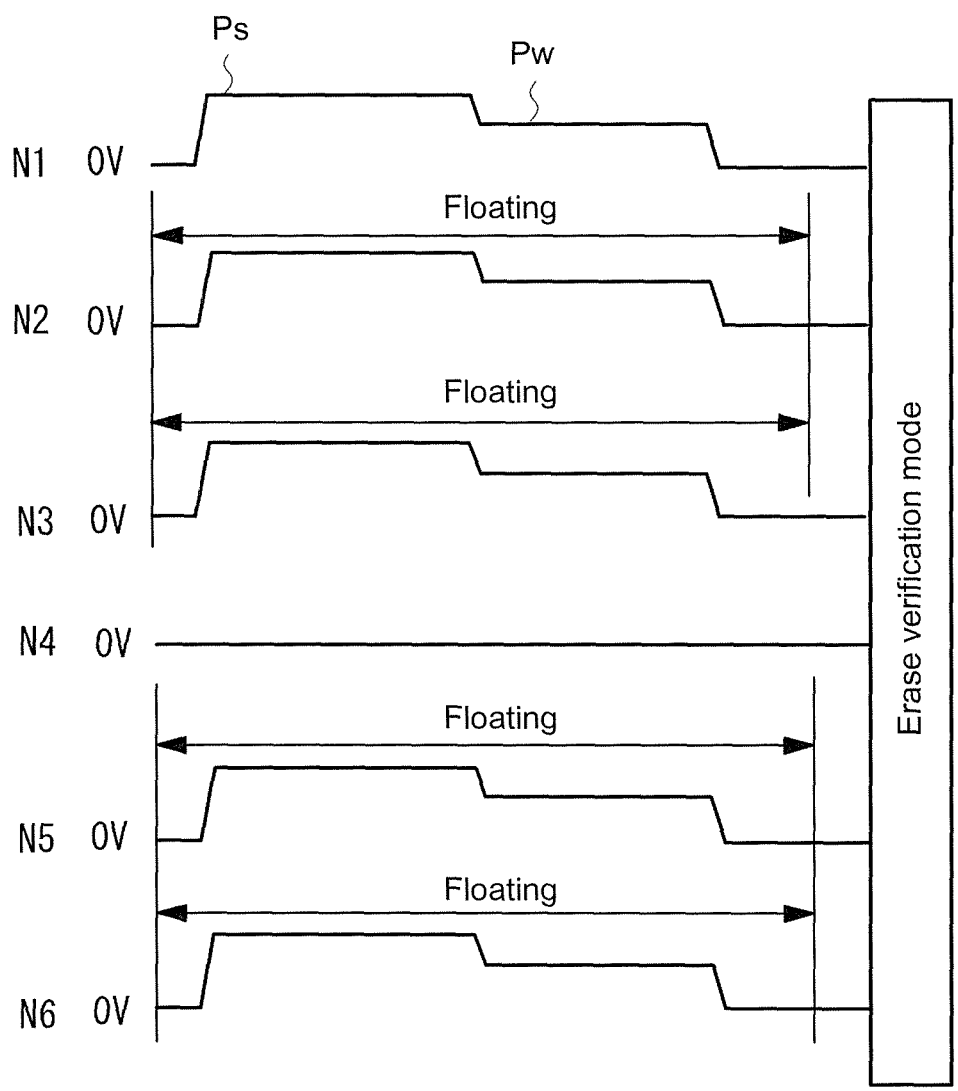
FIG. 8 is a graph illustrating a waveform of an erase pulse applied according to a second embodiment of the invention.

Then, the erasing operation of a second embodiment of the invention will be described with reference to FIG. 8. In the process of applying the erase pulse Ps, after the electrons are emitted from the floating gate to the silicon substrate, the potential setting of the pulse is changed, i.e., the potential provided to the P well 14 is reduced during the process of applying the erase pulse Ps. During this period, the word lines of the selected block are still maintained at 0 V. The potential of the P well 14 is reduced, in the same way as in the first embodiment, so as to reduce a potential difference between the P well 14 and the control gate, and the potential of the weak erase pulse Pw is set in a manner that does not cause the electrons to tunnel from the floating gate to the silicon substrate side. The second embodiment may be considered as the interval Ts between the erase pulse Ps and the weak erase pulse Pw of the first embodiment is set to be 0, without limitation.

Figure 9:
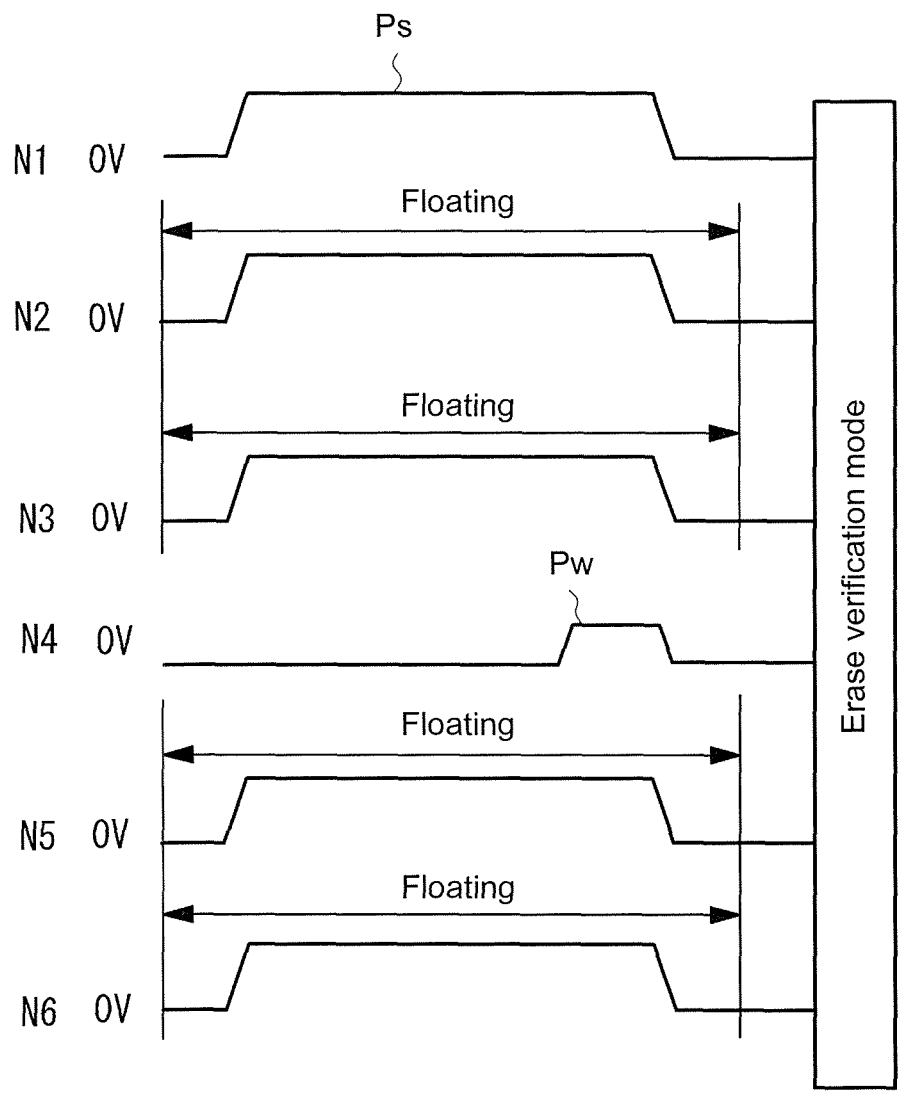
FIG. 9 is a graph illustrating a waveform of an erase pulse applied according to a third embodiment of the invention.

Afterwards, the erasing operation of a third embodiment of the invention will be described with reference to FIG. 9. In the process of applying the erase pulse Ps, the potential difference between the P well 14 and the control gate begins to change from the middle of the process; however, being different from the second embodiment, in the present embodiment, the potential provided to the P well is not changed. That is, in the present embodiment, the weak erase pulse Pw with a specific positive potential is applied to the word lines (control gate) of the selected block, so as to reduce the potential difference between the P well and the control gate, and the potential and period of the weak erase pulse Pw provided to the control gate is set in a manner that does not cause the electrons to tunnel from the floating gate to the silicon substrate side. A timing for the weak erase pulse Pw returning to 0 V is approximately equal to a timing for the erase pulse Ps returning to 0 V.

Figure 10:
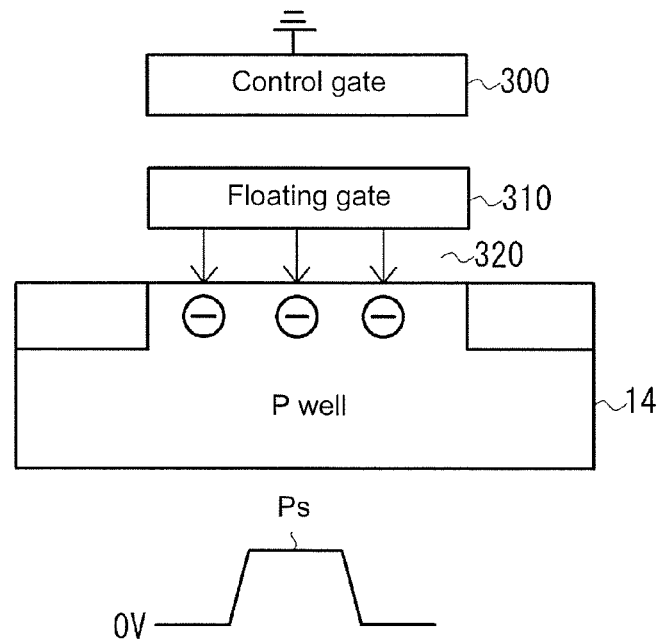
FIG. 10 is a cross-sectional diagram illustrating an electron flow of a memory cell being erased.
Figure 11:
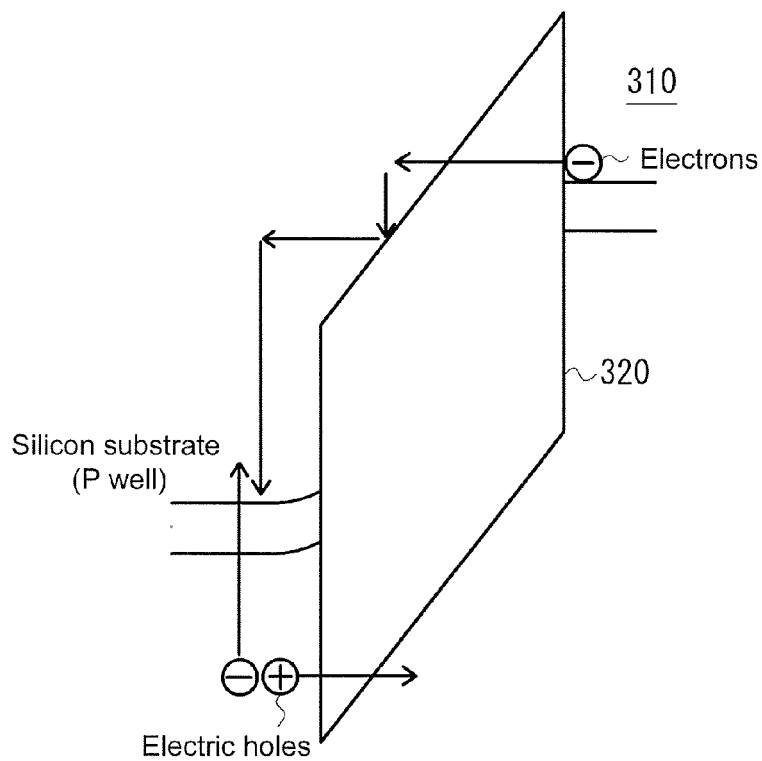
FIG. 11 is a band diagram during the erase pulse being applied.

Then, the reason of applying the weak erase pulse Pw after the erase pulse Ps to achieve the enhancement of the reliability will be described below. Referring to FIG. 10, when the control gate 300 is applied with a voltage of 0 V, and the erase pulse Ps is applied to the P well 14, the tunneling oxide film 320 right under the floating gate 310 is applied with a high voltage, such that the electrons flow from the floating gate 310 to the silicon substrate side by means of the tunneling effect. As a result, when the erasing operation ends, the floating gate 310 has positive charges. Referring to FIG. 11, the electrons arriving the silicon substrate has high energy to produce high-energy electric holes, and a part thereof is injected into the tunneling oxide film 320.

Figure 4A:
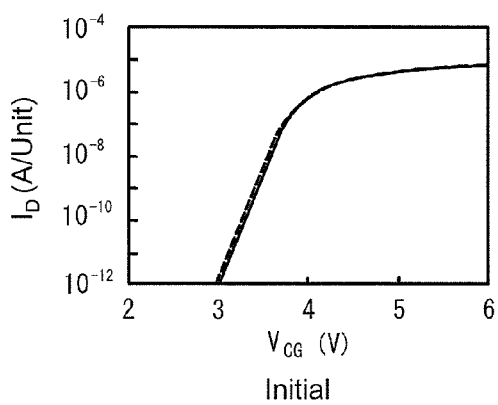
FIG. 4 (A) and FIG. 4 (B) are graphs illustrating interval dependence of I-V characteristics of a memory cell from being erased to written, in which FIG. 4 (A) illustrates initial I-V characteristics, and FIG. 4 (B) illustrates the I-V characteristics after the data is rewritten for 3000 times.
Figure 4B:
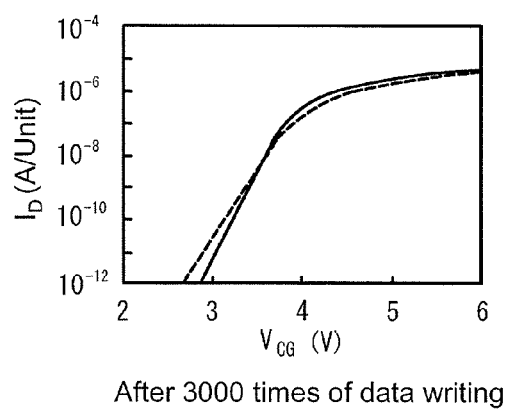
Figure 12:
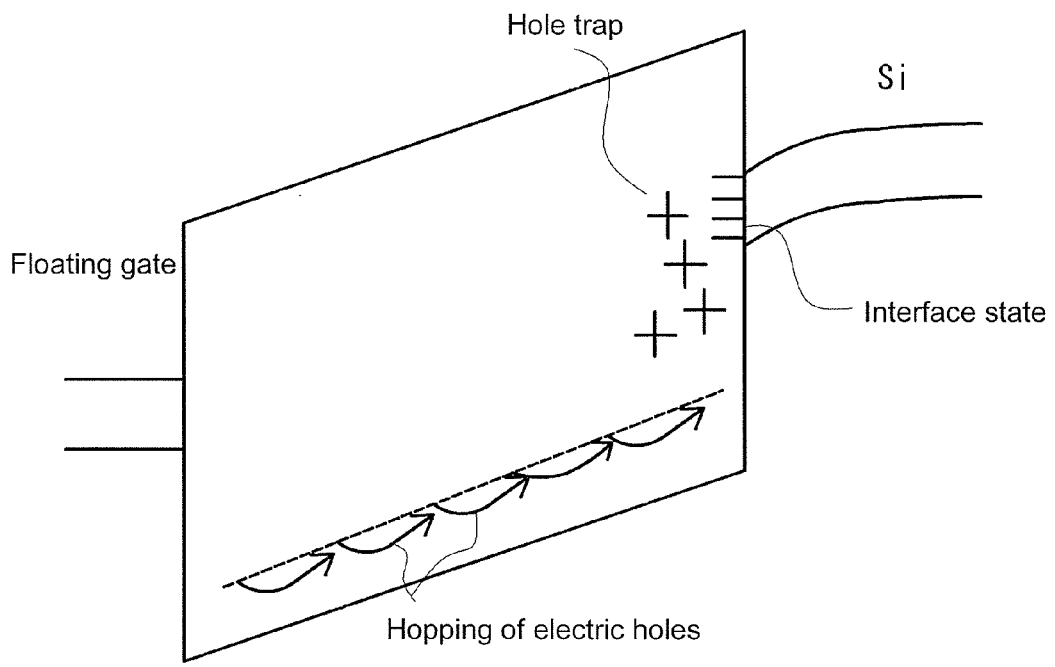
FIG. 12 is a band diagram after the erase pulse is applied in a conventional example.

FIG. 12 is a band diagram illustrating a scenario where the threshold of the memory cells applied with the erase pulse is under 0 V. For the electric holes formed when the erase pulse is injected into the tunneling oxide film 320, if the P well 14 is then set to 0 V, the floating gate 310 has the positive charges, the floating gate 310 has a positive potential relative to a silicon surface due to the charges. Thus, the electric holes in the tunneling oxide film 320 moves slowly toward the silicon substrate side due to the electric field of the oxide film (Poole-Frenkel Current). The part of the electric holes arriving the silicon interface is trapped in the oxide film to generate an interface state (with reference to the paper "IEEE TRANSACTIONS ON NUCLEAR SCIENCE", VOL. 55, NO. 4, pp. 1833-1853, 2008. line 6 of the right column, p. 1836). During the read verification operation, the P well is fixed at 0 V, the word lines become either 0 V or a specific positive potential, and thus, the phenomenon that the electric holes move toward the silicon interface remains unchanged. In this way, in the conventional erasing method, in the period after the erase pulse is applied, the electric holes move toward the silicon interface to form the interface state, which is the same as the scenario of the embodiment illustrated in FIG. 4 above.

Figure 13:
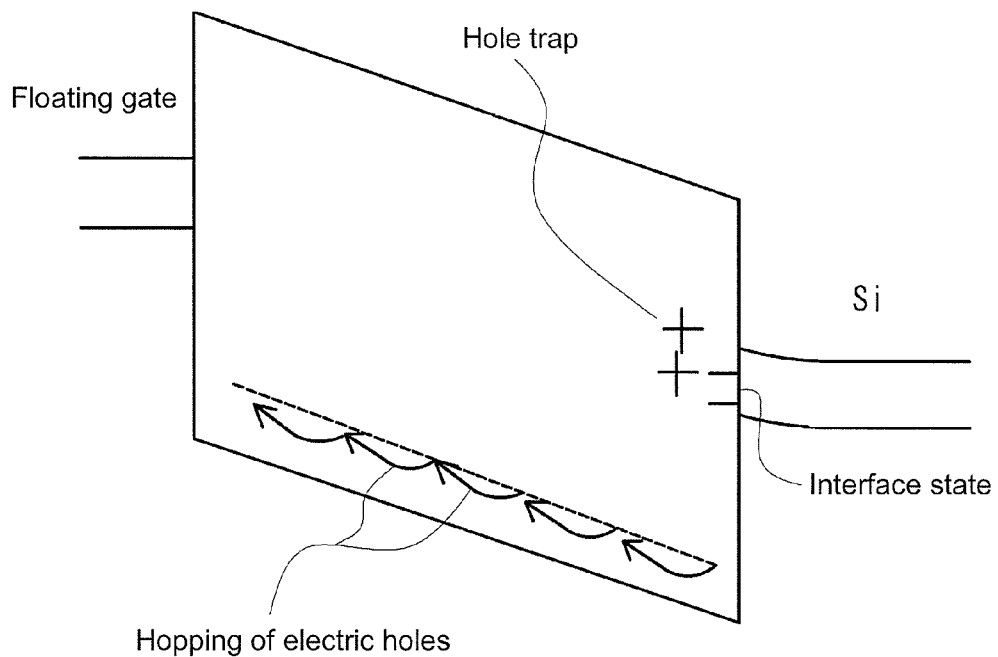
FIG. 13 is a band diagram of applying a weak erase pulse after the erase pulse is applied according to an embodiment of the invention.

On the other hand, in the present embodiment, the weak erase pulse Pw is applied immediately after the erase pulse Ps is applied, and a band diagram thereof is illustrated in FIG. 13. When the weak erase pulse Pw with the positive potential is applied to the P well 14, the potential of the floating gate 310 becomes higher than that of the silicon surface. Accordingly, during the process of applying the erase pulse Ps, the electric holes injected in to the tunneling oxide film 320 moves toward the floating gate 310 duet to the electric field of the oxide film. In this way, the electric holes are not accumulated near the silicon interface, such that the electric holes is prevented from being trapped near the silicon interface, and the forming of the silicon energy state is prevented. Therefore, the deterioration in reliability can be suppressed for the memory cells.

Figure 14:
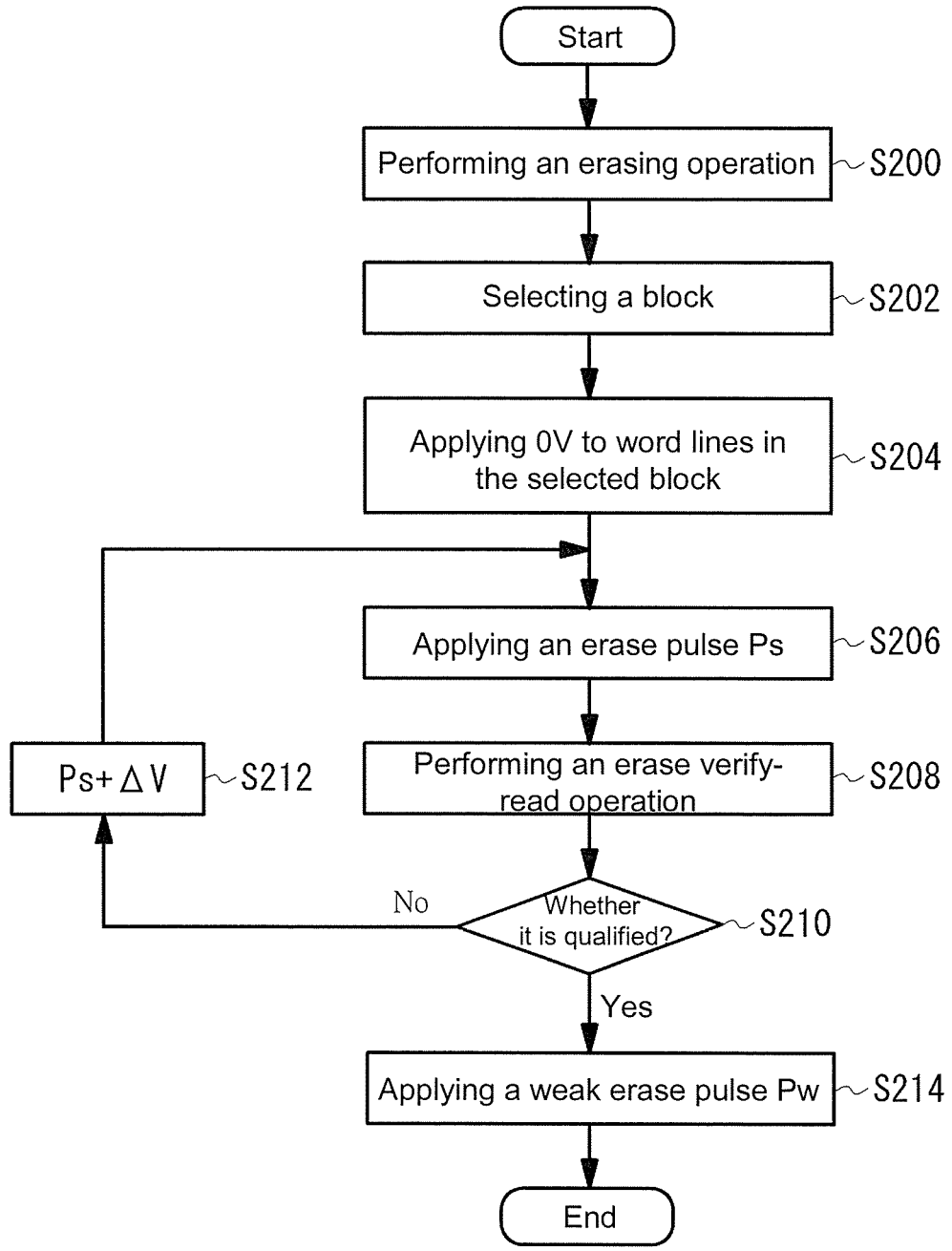
FIG. 14 is a flowchart of the erasing operation of the flash memory according to a fourth embodiment of the invention.

Subsequently, a fourth embodiment of the invention will be described with reference to FIG. 14. In the first through the third embodiments, the erase pulse Ps and the immediately following weak erase pulse Pw are considered as a set, and then the erase verification is performed. However, in the present embodiment, the application of the erase pulse Ps and the erase verification are considered as a set, and after being determined as qualified through the erase verification, the weak erase pulse Pw is applied. In FIG. 14, the sequence including steps S200 to S206 is the same as the sequence including steps S100 to S106 of the first to the third embodiments illustrated in FIG. 6 and thus, will not be repeatedly described. In the fourth embodiment, after the erase pulse Ps is applied, an erase verify-read operation is performed (step S208). If a part of the erase units are determined as disqualified due to the threshold thereof being insufficiently reduced (step S210), an erase pulse Ps that is equal to the previous erase pulse Ps plus ΔV is generated (step S212) and applied again (step S206) for performing the erase verify-read operation (step S208). When the erasing units in the selected block are all qualified, the weak erase pulse Pw is applied lastly. The bias voltages condition for applying the weak erase pulse Pw is the same as that in the first to the third embodiment, i.e., the weak erase pulse Pw is set in the manner does not cause the electrons to emit from the floating gate to the silicon substrate side. In the scenario of the embodiment, the application of the weak erase pulse Pw may also achieve the following effect, which causes the electric holes to hop into the floating gate side, such that the hole trap on the silicon interface are suppressed to prevent the forming of the silicon interface state.

In the first embodiment to the third embodiment, an NAND flash memory having the memory cell array that is two-dimensionally forming on the surface of the silicon substrate is exemplarily illustrated; however, the invention is also applicable to the erasing operation for an NAND flash memory having a memory cell array that is three-dimensionally formed.

A memory cell array with a three-dimensional structure includes two types. In the first type, the channel portion stands vertically, and the gates surround the channel portion and horizontally placed, so as to stack up in this way to form a plurality of stages. In the second type, the channel portion is a horizontal bar and stacked to form a plurality of stages, and the gates extend vertically. In both types, the channel portion is not formed in the P well on the N well.

Figure 15:
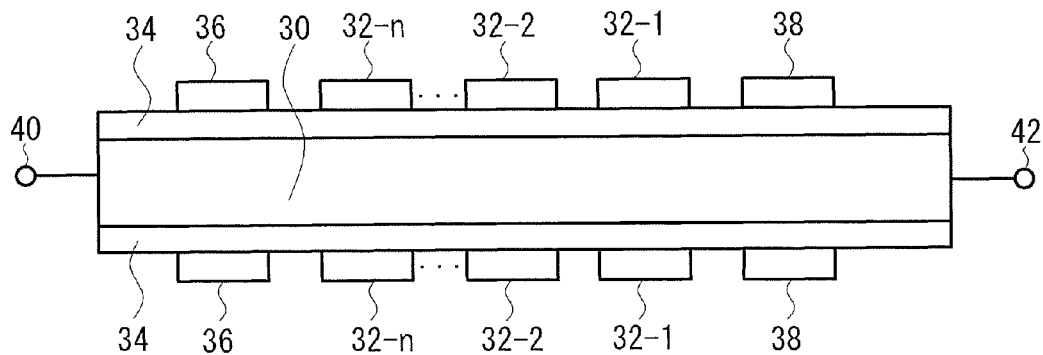
FIG. 15 is a schematic cross-sectional diagram illustrating a structure of a memory cell array of a 3-dimensional (3D) NAND flash memory that is applicable to the invention.
Figures 16A, 16B:
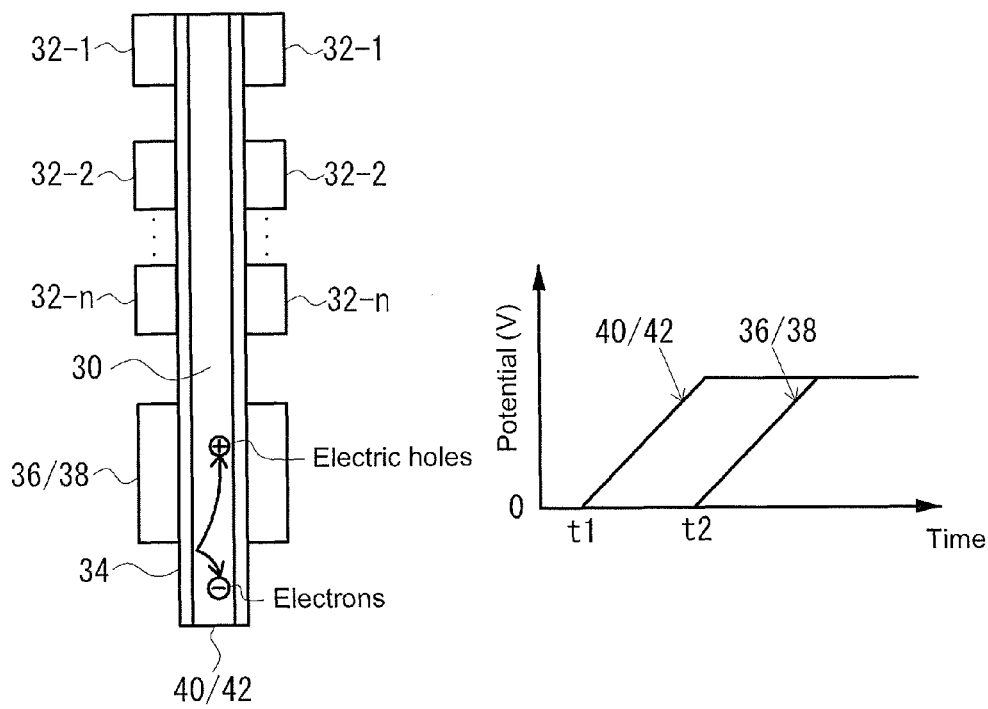
FIG. 16 (A) and FIG. 16 (B) schematically illustrate a method of applying a high voltage to a channel portion of the memory cell array of the 3D NAND flash memory during the erasing operation.

Referring to FIG. 15, a bar-shaped channel portion 30 is formed on the substrate surface. The channel portion 30 includes, for example, a p-type polysilicon. Control gates 32-1 to 32-n of the memory cells are formed in a manner of surrounding the periphery of the channel portion 30. An oxide-nitride-oxide (ONO) structure 34 in a manner of silicon oxide films sandwiching a silicon nitride film is formed between the control gate 32-1, 32-2, ... 32-n and the channel portion 30, in which the silicon nitride film serves as a charge accumulation layer. A selection gate 36 of a bit line selection transistor is formed at one terminal side of the channel portion 30, and a selection gate 38 of a source line selection transistor is formed at the other terminal side. When the bit line selection transistor is conducted via the selection gate 36, the channel portion 30 is electrically connected to a bit line contact portion 40, and the source line selection transistor is conducted via the selection gate 38, the channel portion 30 is electrically connected to a source line contact portion 42. Thus, referring to FIG. 16 (A) and FIG. 16 (B), when a high voltage is provided to the channel portion 30 during the erasing operation, the bit line contact portion 40 or the source line contact portion 42 is applied with the high-voltage erase pulse Ps at a time t1, then, the potentials of the selection gates 36 and 38 on both terminals or one of the terminals of the cell array are set to be lower than the potential of the erase pulse Ps at a time t2, such that electric holes are generated in the channel portion 30 near the selection gate, and the generated electric holes are injected into the entire channel portion of the cell array. Thereby, the entire channel portion has the high voltage, and if the control gate 32 is set to 0 V, the electrons are extracted from the charge accumulation layer 34 to the channel portion 30 (with reference to the paper, Y. Fukuzumi et al., 2007, "Proc. of IEEE International Electrons Device Meeting" Proc. pp. 449-452). The NAND flash memory with the memory cell array in the three-dimensional structure is applicable to a fifth embodiment to a seventh embodiment of the invention, which will be described below.

In the fifth embodiment, the high voltage applied to the channel portion is set to the erase pulse Ps in the three-dimensional structure of the memory cells in the same manner as the first to the third embodiments, the weak erase pulse Pw is applied immediately after the erase pulse Ps, and then the erase verify-read operation for detecting whether the threshold of the erasing units is under a specific value is performed.

Figure 17:
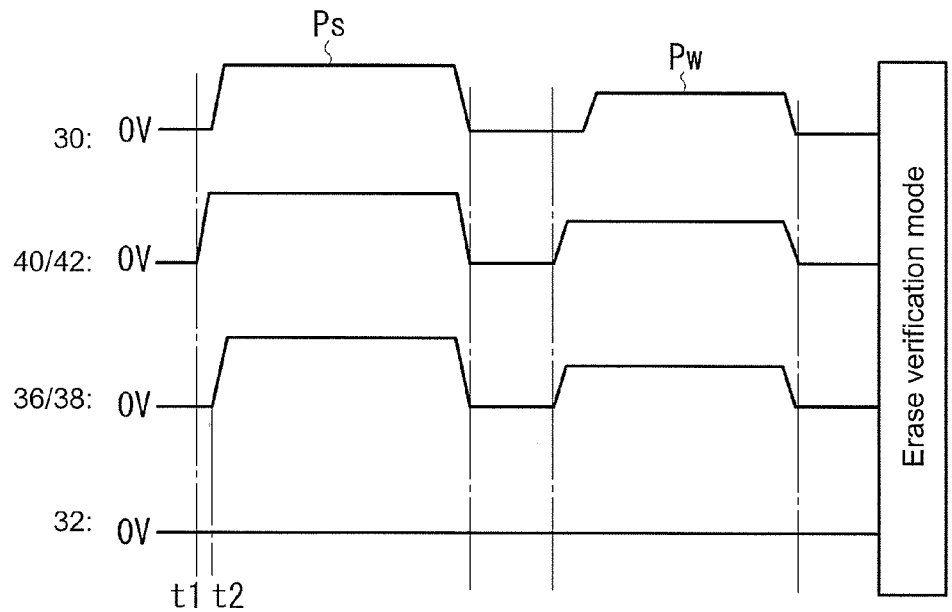
FIG. 17 is a graph illustrating a waveform of applying the erase pulse according to a fifth embodiment of the invention.

FIG. 17 illustrates waveforms of applying the erase pulse according to the fifth embodiment. The fifth embodiment is corresponding to the first embodiment, where the weak erase pulse Pw is applied immediately after the erase pulse is applied. In the three-dimensional memory cell structure, the high voltage applied to the channel portion 30 is set to the erase pulse Ps, the weak erase pulse Pw is applied immediately after the erase pulse Ps is applied, and then, in the same manner as the first embodiment, the erase verify-read operation for detecting whether the threshold of the erasing units is under a specific value is performed (with reference to FIG. 6). If the threshold is under the specific value, the application of the erase pulse Ps ends, and if the threshold is over the specific value, the application of the erase pulse Ps and the application of the weak erase pulse Pw immediately thereafter are performed again in the manner that does not cause the current tunneling effect that the electrons flow from the charge accumulation layer 34 toward the silicon side, so as to set the potential provided to the channel portion 30 to be shorter. The shorter the pulse interval Ts from the application of the erase pulse Ps to the immediately following application of the weak erase pulse Pw the better, e.g., shorter than 0.5 seconds.

Figure 18:
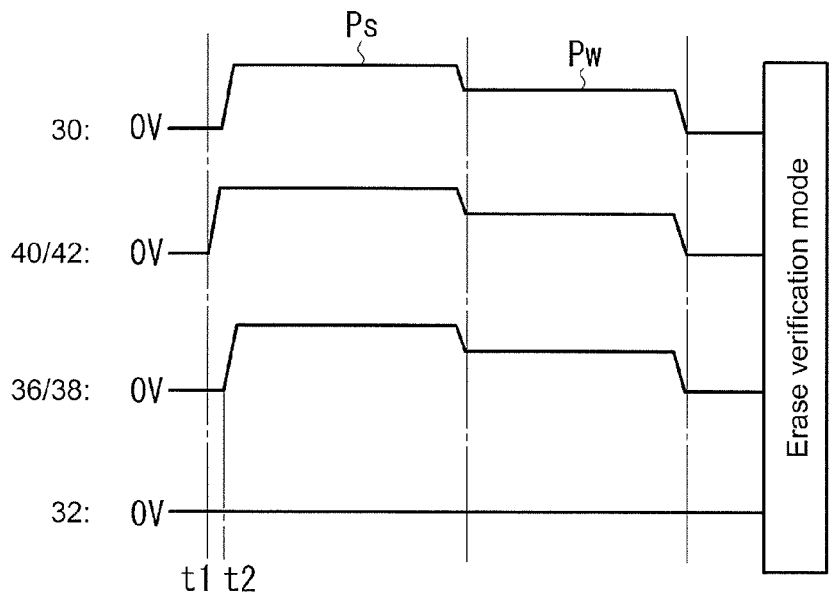
FIG. 18 is a graph illustrating a waveform of applying the erase pulse according to a sixth embodiment of the invention.

The sixth embodiment of the invention will be described with reference to FIG. 18. As the same as the second embodiment, in the sixth embodiment, in the three-dimensional memory cell structure, the potential setting begins to change from the middle during the process of applying the erase pulse Ps to the channel portion 30. Namely, the potential provided to the channel portion 30 begins to be reduced from the middle. At this time, the word lines of the selected block are still fixed at 0 V. By means of reducing the potential of the channel portion 30, the potential difference between the channel portion 30 and the control gate 32 is reduced, such that the potential provided to the control gate 32 is set in the same manner as above that does not cause the electrons to tunnel from the charge accumulation layer 34 to the channel portion 30.

Figure 19:
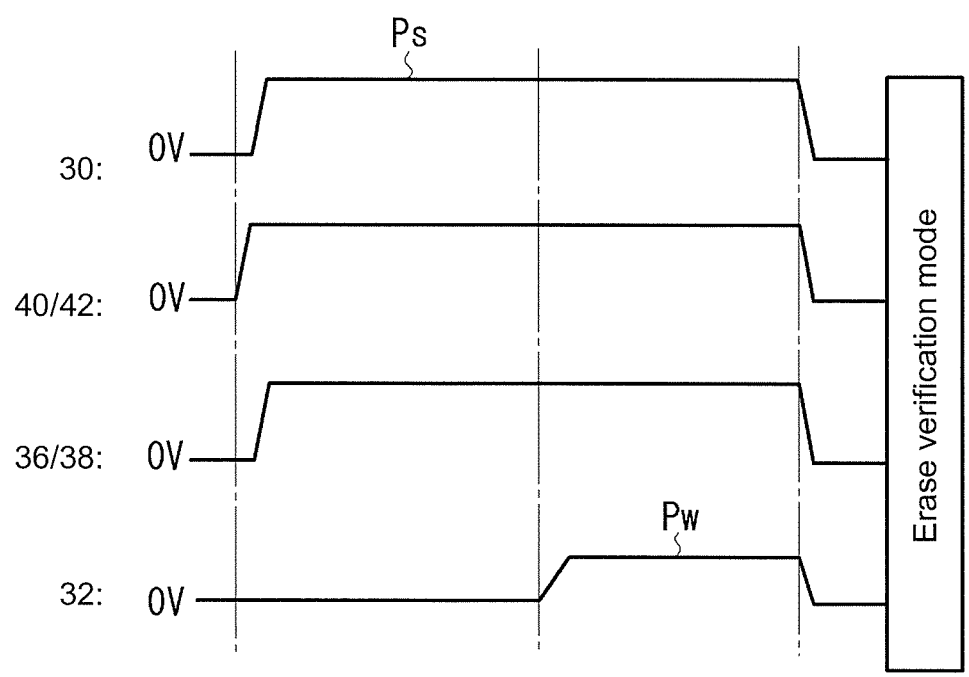
FIG. 19 is a graph illustrating a waveform of applying the erase pulse according to a seventh embodiment of the invention.

Subsequently, the seventh embodiment will be described with reference to FIG. 19. As the same as the third embodiment, in the seventh embodiment, the potential setting begins to change from the middle during the process of applying the erase pulse P, but the potential provided to the channel portion 30 remains unchanged, and a specific positive potential is applied to the control gate 32 of the selected block. Thereby, the potential difference between the channel portion 30 and the control gate 32 is reduced, such that the potential provided to the control gate 32 is set in the same manner as above that does not cause the electrons to tunnel from the charge accumulation layer 34 to the channel portion 30.

Moreover, in the fifth to the seventh embodiments, the erase pulse Ps and the weak erase pulse Pw may be considered as a set for the application and then the erase verification is performed in the same manner as illustrated in FIG. 6, for example. However, in the fifth to the seventh embodiments, the application of the erase pulse Ps and the erase verification may also be considered as a set in the same manner as in the fourth embodiment (with reference to FIG. 14), and the weak erase pulse Pw is applied after the threshold of each erasing unit in the selected block is determined as qualified.

Figure 1:
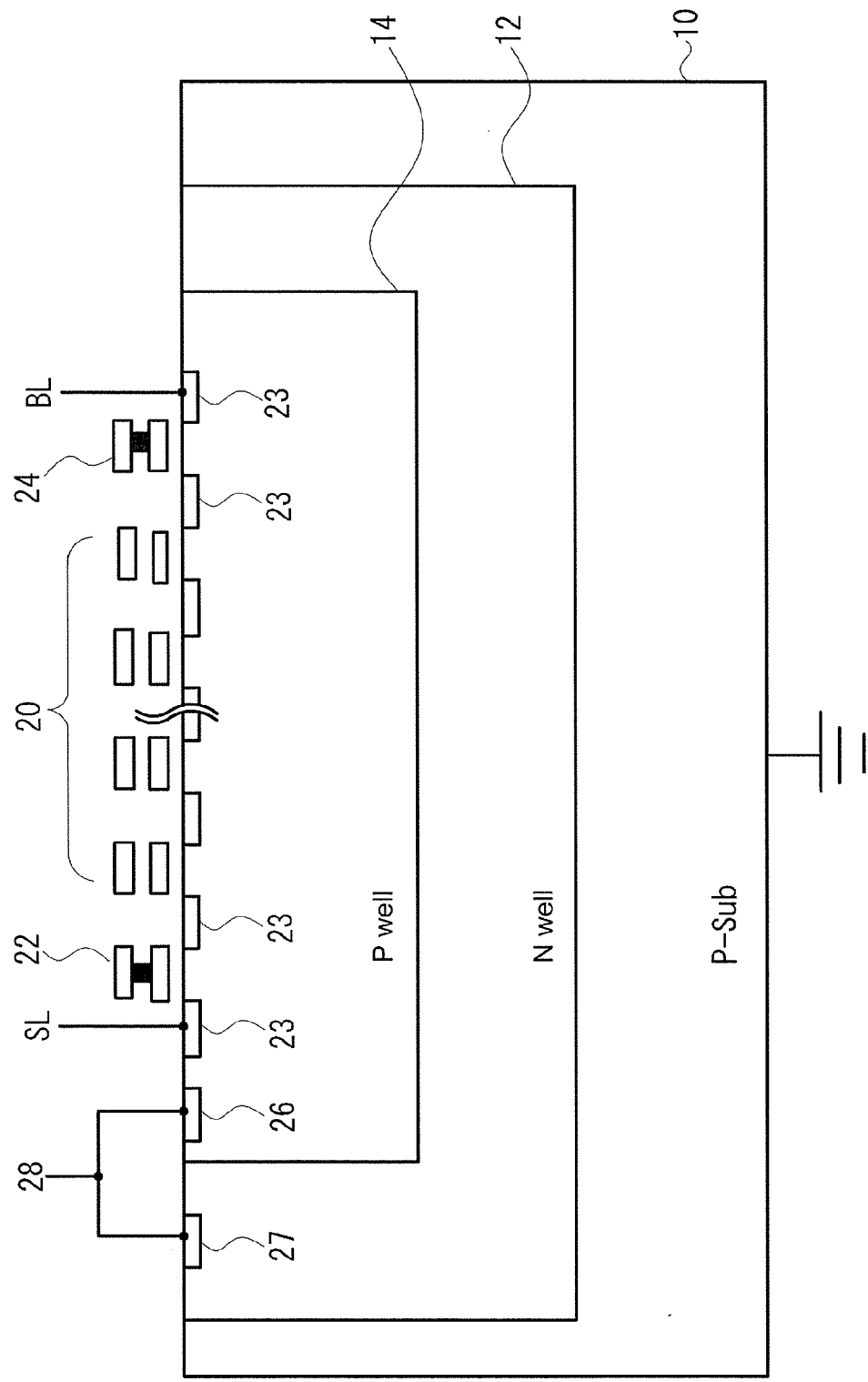
FIG. 1 is a schematic cross-sectional diagram illustrating a structure of a cell array of an NAND flash memory.
Figure 20:
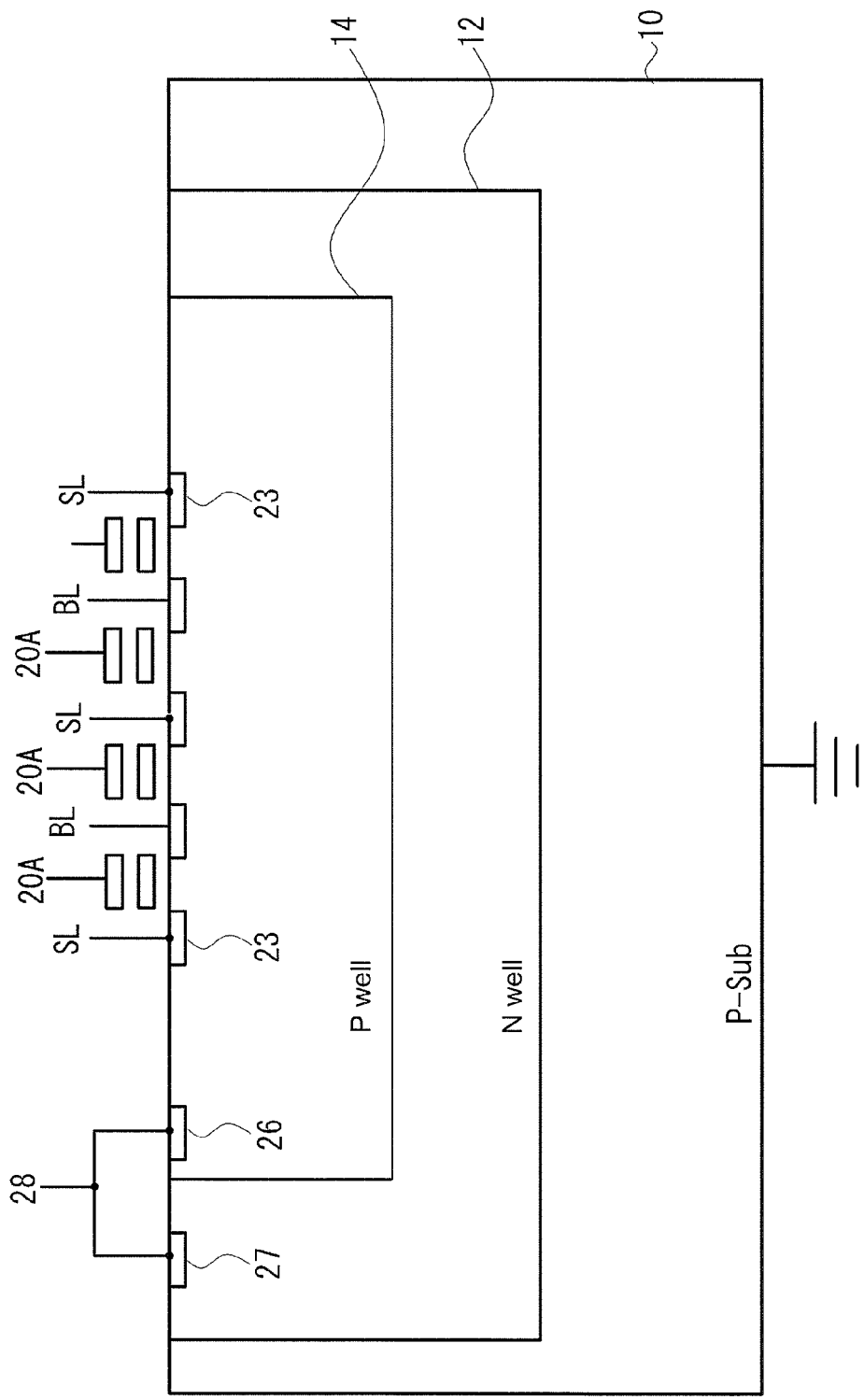
FIG. 20 is a schematic cross-sectional structural diagram illustrating a cell array portion of an NOR flash memory applicable to the invention.

Subsequently, an eighth embodiment of the invention will be described. In the first to the seventh embodiments, the NAND flash memory is exemplarily described, but the invention is also applicable to an NOR flash memory. In a cell array of an NOR flash memory, memory cells are individually accessed and arranged in an array, and each memory cell is connected in parallel between the bit line and the source line. FIG. 20 is a schematic cross-sectional structural diagram illustrating a cell array of an NOR flash memory, in which the elements same as those in the NAND flash memory illustrated in FIG. 1 are labeled by the same reference numerals.

In the NOR flash memory, the data writing operation is performed by injecting hot electrons on the channel surface into the charge accumulation layer (the floating gate) which is different from that of the NAND flash memory, but the data erasing operation is performed by setting the control gate 20A as 0 V, applying the high voltage to the P well 14 and causing the electrons to tunnel from the charge accumulation layer to the silicon side, which is the same as that of the NAND flash memory. Thus, in the eighth embodiment, when data of a selected memory cell is to be erased, the erase pulse Ps is applied, and then the weak erase pulse Pw is immediately applied according to the first to the fourth embodiments, such that the hole trap on the silicon interface of the memory cells of the NOR flash memory are suppressed, so as to prevent the forming of the silicon interface state to mitigate the reliability deterioration caused by data rewriting.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A data erasing method of a non-volatile semiconductor memory apparatus, wherein memory cells are formed in the non-volatile semiconductor memory apparatus, and each of the memory cells comprises a control gate, a charge accumulation layer and a channel region, the data erasing method comprising:

after maintaining the control gate at a fixed voltage and applying a high-voltage first erase pulse to the channel region, so as to emit electrons from the charge accumulation layer to the channel region, maintaining the control gate at the fixed voltage and applying a first weak erase pulse with a voltage lower than the voltage of the first erase pulse to the channel region, wherein the voltages of the first erase pulse and the first weak erase pulse are positive; and performing a first erase verification of determining whether the data erasing is qualified, wherein the first erase verification is performed after the first erase pulse and the first weak pulse are applied, wherein the first weak erase pulse is immediately applied following the first erase pulse, the first weak erase pulse and the first erase pulse are considered as a set, and then the first erase verification is performed after the set of the first weak erase pulse and the first erase pulse, wherein when the data erasing is determined as disqualified through the first erase verification, maintaining the control gate at the fixed voltage and applying a second erase pulse with a voltage greater than the voltage of the first erase pulse to the channel region, and maintaining the control gate at the fixed voltage and applying a second weak erase pulse with a voltage lower than the voltage of the second erase pulse to the channel region, wherein the voltages of the second weak erase pulse is larger than or equal to the voltage of first weak erase pulse.

2. The data erasing method according to claim 1, wherein the first weak erase pulse is applied in a fixed period after the first erase pulse is applied.

3. The data erasing method according to claim 1, wherein during the process of applying the first erase pulse, the first weak erase pulse is applied through reducing a peak of the first erase pulse.

4. The data erasing method according to claim 1, wherein the first weak erase pulse has a size that does not cause the electrons to emit from the charge accumulation layer toward the channel region.

5. The data erasing method according to claim 2, wherein the first weak erase pulse has a size that does not cause the electrons to emit from the charge accumulation layer toward the channel region.

6. The data erasing method according to claim 3, wherein the first weak erase pulse has a size that does not cause the electrons to emit from the charge accumulation layer toward the channel region.

7. A data erasing method of a non-volatile semiconductor memory apparatus, wherein memory cells are formed in the non-volatile semiconductor memory apparatus, and each of the memory cells comprises a control gate, a charge accumulation layer and a channel region, the data erasing method comprising:

after maintaining the control gate at a fixed voltage and applying a high-voltage erase pulse to the channel region, so as to emit electrons from the charge accumulation layer to the channel region, applying a weak pulse with a voltage lower than the voltage of the erase pulse to the control gate during the process of applying the erase pulse.

8. A non-volatile semiconductor memory apparatus, comprising:
- a memory cell array, comprising memory cells formed therein, wherein each of the memory cells comprises a control gate, a charge accumulation layer and a channel region;
- a selection portion, selecting a memory cell with data to be erased from the memory cell array; and
- a control portion, controlling the data erasing performed on the memory cell selected by the selection portion,
- wherein after the control portion maintains the control gate at a fixed voltage, applies a high-voltage first erase pulse to the channel region, so as to emit electrons from the charge accumulation layer to the channel region, the control portion maintains the control gate at the fixed voltage and applying a first weak erase pulse with a voltage lower than the first erase pulse to the channel region, wherein the voltages of the first erase pulse and the first weak erase pulse are positive,
- wherein the control portion performs a first erase verification of determining whether the data erasing is qualified, wherein the first erase verification is performed after the first erase pulse and the first weak pulse are applied, wherein the first weak erase pulse is immediately applied following the first erase pulse, the first weak erase pulse and the first erase pulse are considered as a set, and then the first erase verification is performed after the set of the first weak erase pulse and the first erase pulse,
- wherein when the data erasing is determined as disqualified through the first erase verification, the control portion maintains the control gate at the fixed voltage and applies a second erase pulse with a voltage greater than the voltage of the first erase pulse to the channel region, and then maintains the control gate at the fixed voltage and applies a second weak erase pulse with a voltage lower than the voltage of the second erase pulse to the channel region, wherein the voltages of the second weak erase pulse is larger than or equal to the voltage of first weak erase pulse.

9. The non-volatile semiconductor memory apparatus according to claim 8, wherein the control portion applies the first weak erase pulse in a fixed period after applying the first erase pulse.

10. The non-volatile semiconductor memory apparatus according to claim 8, wherein the control portion applies the first weak erase pulse through reducing a peak value of the first erase pulse during the process of applying the erase pulse.

11. The non-volatile semiconductor memory apparatus according to claim 8, wherein the first weak erase pulse has a magnitude that does not cause the electrons to emit from the charge accumulation layer toward the channel region.

12. The non-volatile semiconductor memory apparatus according to claim 8, wherein the memory cell array comprises a NAND string formed by a plurality of memory cells connected in serial, wherein the selection portion selects a block from the memory cell array, and the control portion applies the first erase pulse and the first weak erase pulse to the selected block.

13. The non-volatile semiconductor memory apparatus according to claim 8, wherein the memory cell array comprises a NAND string formed by a plurality of memory cells connected in serial, wherein the selection portion selects a block from the memory cell array, and the control portion applies the first erase pulse to the selected block and applies the first weak erase pulse to a control gate of a memory cell in the selected block during the process of applying the erase pulse.

14. A non-volatile semiconductor memory apparatus, comprising:
- a memory cell array, comprising memory cells formed therein, wherein each of the memory cells comprises a control gate, a charge accumulation layer and a channel region;
- a selection portion, selecting a memory cell with data to be erased from the memory cell array; and
- a control portion, controlling the data erasing performed on the memory cell selected by the selection portion,
- wherein the control portion maintains the control gate at a fixed voltage, applies a high-voltage erase pulse to the channel region, and applies a weak pulse with a voltage lower than the erase pulse to the control gate during the process of applying the erase pulse after emitting electrons from the charge accumulation layer to the channel region.

* * * * *